(12) United States Patent
Kim

(10) Patent No.: US 10,102,785 B2
(45) Date of Patent: *Oct. 16, 2018

(54) FLEXIBLE DISPLAY DEVICE

(71) Applicant: SAMSUNG DISPLAY CO., LTD., Yongin-si, Gyeonggi-do (KR)

(72) Inventor: Eunah Kim, Yongin-si (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/684,044

(22) Filed: Aug. 23, 2017

(65) Prior Publication Data

US 2017/0352302 A1    Dec. 7, 2017

Related U.S. Application Data

(63) Continuation of application No. 14/100,501, filed on Dec. 9, 2013, now Pat. No. 9,747,825.

(30) Foreign Application Priority Data

Jun. 13, 2013  (KR) .................. 10-2013-0067902

(51) Int. Cl.
  *G09G 3/00* (2006.01)
  *G02F 1/13* (2006.01)
  *G02F 1/1333* (2006.01)

(52) U.S. Cl.
  CPC .......... *G09G 3/006* (2013.01); *G02F 1/1309* (2013.01); *G02F 1/133305* (2013.01)

(58) Field of Classification Search
  CPC .. G09G 3/006; G02F 1/1309; G02F 1/133305
  USPC ............................................. 324/750.3, 537
  See application file for complete search history.

(56) References Cited

U.S. PATENT DOCUMENTS

| 7,301,360 | B2 | 11/2007 | Kim et al. |
| 9,747,825 | B2* | 8/2017 | Kim ..................... G02F 1/1309 |
| 2005/0128173 | A1 | 6/2005 | Booh et al. |
| 2006/0103412 | A1 | 5/2006 | Kimura et al. |
| 2009/0206334 | A1 | 8/2009 | Yoon et al. |
| 2010/0195039 | A1 | 8/2010 | Park |
| 2010/0220092 | A1 | 9/2010 | Kimura |
| 2010/0271040 | A1 | 10/2010 | Jafarian-Tehrani |
| 2011/0005090 | A1 | 1/2011 | Lee et al. |
| 2011/0095975 | A1 | 4/2011 | Hwang et al. |
| 2012/0256720 | A1 | 10/2012 | Byun et al. |
| 2013/0127606 | A1 | 5/2013 | Chang |
| 2013/0329422 | A1 | 12/2013 | Park et al. |
| 2014/0300649 | A1 | 10/2014 | Park |

(Continued)

FOREIGN PATENT DOCUMENTS

KR  10-2003-0081970 A  10/2003
KR  10-2010-0089329 A  8/2010

*Primary Examiner* — Christopher Mahoney
(74) *Attorney, Agent, or Firm* — Lee & Morse, P.C.

(57) ABSTRACT

A flexible display device includes a display panel, at least one inspection part, and a detector. The display panel includes at least one bending portion and a display area. The inspection part is located on the bending portion and bends in a manner similar to the bending portion. The detector applies an inspection signal to the inspection part and receives an output signal from the inspection part. A crack in the inspection part is then determined based on a comparison of the inspection and output signals.

15 Claims, 7 Drawing Sheets

(56) References Cited

U.S. PATENT DOCUMENTS

2014/0319523 A1  10/2014  Lee
2015/0187279 A1   7/2015  Lee et al.

* cited by examiner

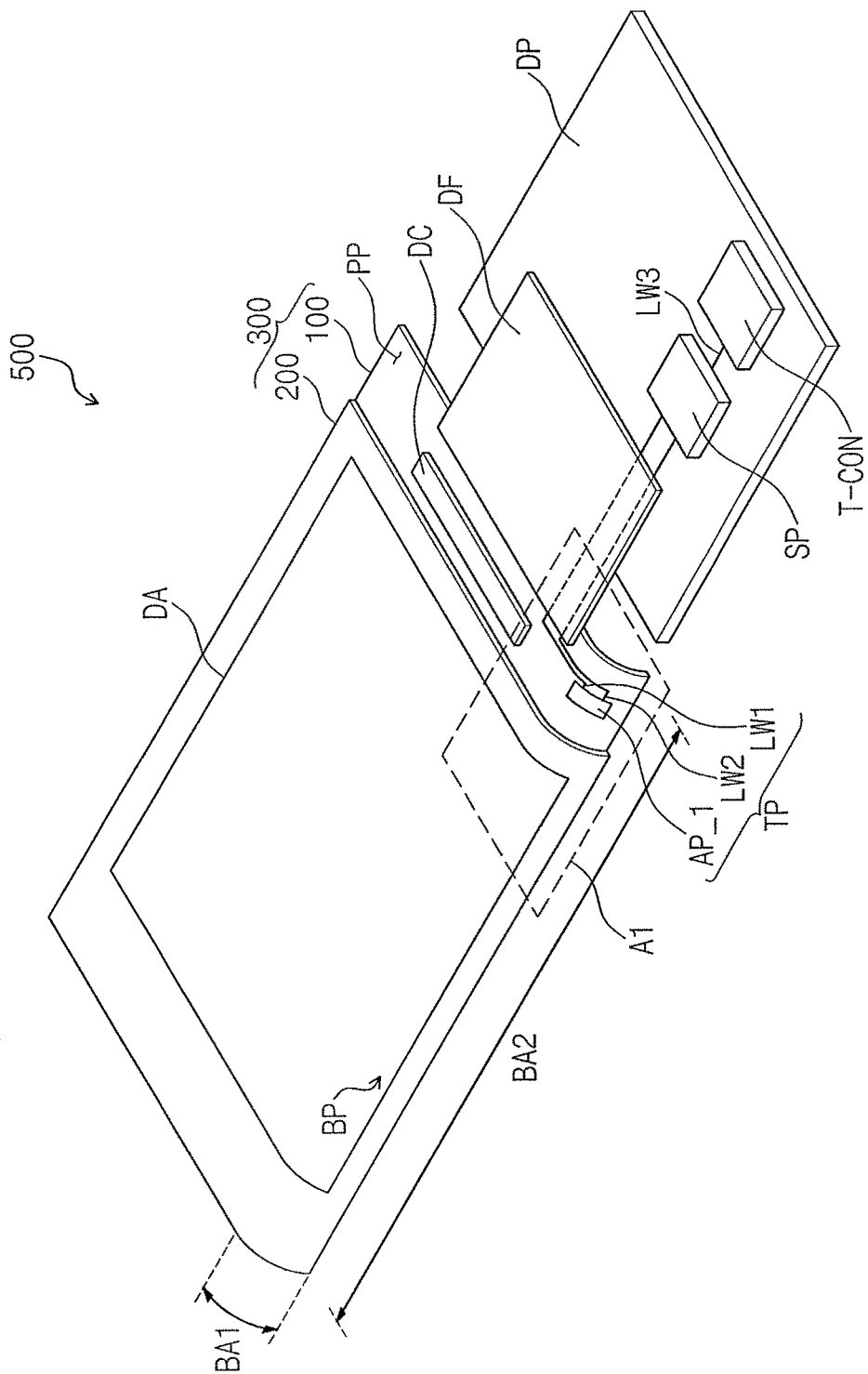

FLEXIBLE DISPLAY DEVICE

CROSS-REFERENCE TO RELATED APPLICATIONS

This is a continuation application based on pending application Ser. No. 14/100,501, filed Dec. 9, 2013, the entire contents of which is hereby incorporated by reference.

Korean Patent Application No. 10-2013-0067902, filed on Jun. 13, 2013, and entitled, "Flexible Display Device," is incorporated by reference herein in its entirety.

BACKGROUND

1. Field

One or more embodiments described herein relate to a display device.

2. Description of the Related Art

A flexible display device that includes pixels arranged on a flexible substrate is expected to be very desirable for use in consumer and other electronic devices, not only because of its bendable screen but also because such a device could be easily transported.

SUMMARY

A flexible display device may include a display panel including at least one bending portion and a display area; at least one inspection part on the bending portion, the inspection part bending with the bending portion; and a detector to apply an inspection signal to the inspection part and to receive an output signal from the inspection part, wherein detector compares the inspection signal and the output signal to detect a crack in the inspection part.

The inspection part may include an inspection pattern on the bending portion; and a connection wire to electrically connect the inspection pattern to the detector, wherein the connection wire is to transmit the inspection signal and the output signal between the inspection pattern and the detector. The inspection pattern may have a width greater than a width of the connection wire. The inspection pattern may include a semiconductor material. The semiconductor material may include silicon.

The display panel may include a substrate; a thin film transistor on the substrate; a first electrode electrically connected to the thin film transistor; an organic light emitting layer on the first electrode to emit light; and a second electrode on the organic light emitting layer. The inspection pattern may include a same material as an active layer of the thin film transistor.

The display panel may include a first substrate; a thin film transistor on the first substrate; a first electrode electrically connected to the thin film transistor; a second substrate facing the first base substrate; a second electrode on the second substrate; and a liquid crystal layer between the first and second substrates.

The inspection pattern may include a same material as an active layer of the thin film transistor.

The inspection part may have a line shape electrically connected to the detector to transmit the inspection signal and the output signal. The inspection line may include molybdenum.

The display area and a bending area included in the bending portion may overlap each other. A plurality of inspection parts may be included in the bending portion. A plurality of bending portions and a plurality of inspection parts may also be included, wherein each of the bending portions includes at least one of the inspection parts.

The detector may detect a crack occurring in the inspection part based on a resistance of the inspection part, the detector determining the resistance of the inspection part based on the inspection signal and the output signal.

The display device may include a driving circuit board to drive the display panel, wherein the detector outputs a result signal indicative of a crack in the inspection part to the driving circuit board, and wherein the driving circuit board controls the display panel based on the result signal. The driving circuit board may control the display panel to be turned off when a crack is detected in the inspection part.

A display device may include a display area; a bent area adjacent the display area; and an inspection part adjacent the bent area, wherein the inspection part and the bent area have substantially a same brittleness and wherein the inspection part outputs a signal indicative of a crack. The bent area may include a portion of the display area. The portion of the display area follows a bend in the bent area.

BRIEF DESCRIPTION OF THE DRAWINGS

Features will become apparent to those of ordinary skill in the art by describing in detail exemplary embodiments with reference to the attached drawings in which:

FIG. 1 illustrates an embodiment of a flexible display device;

DETAILED DESCRIPTION

Figure 2A:
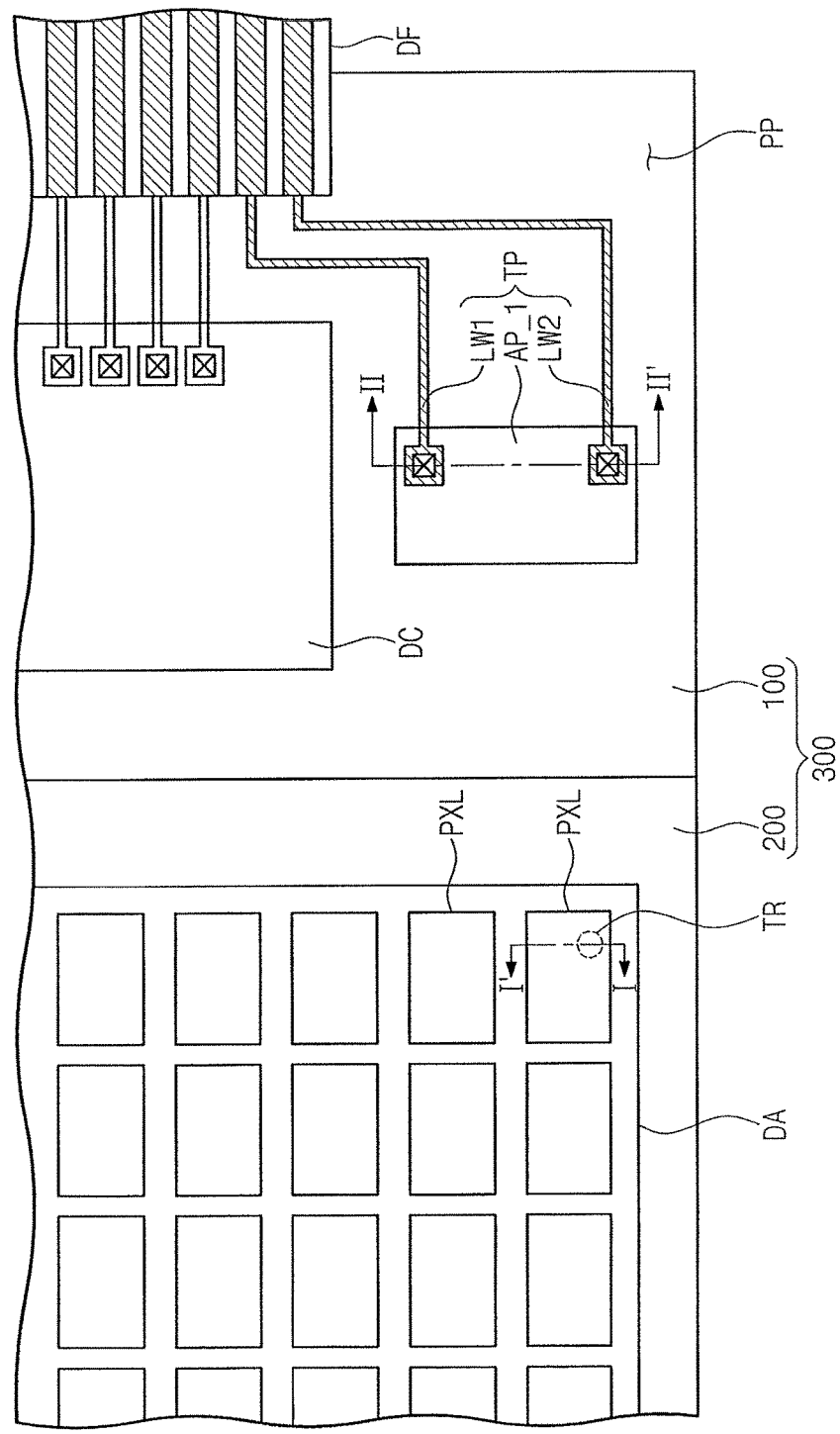
FIG. 2A illustrates a partially enlarged side view of a first area in FIG. 1.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2B:
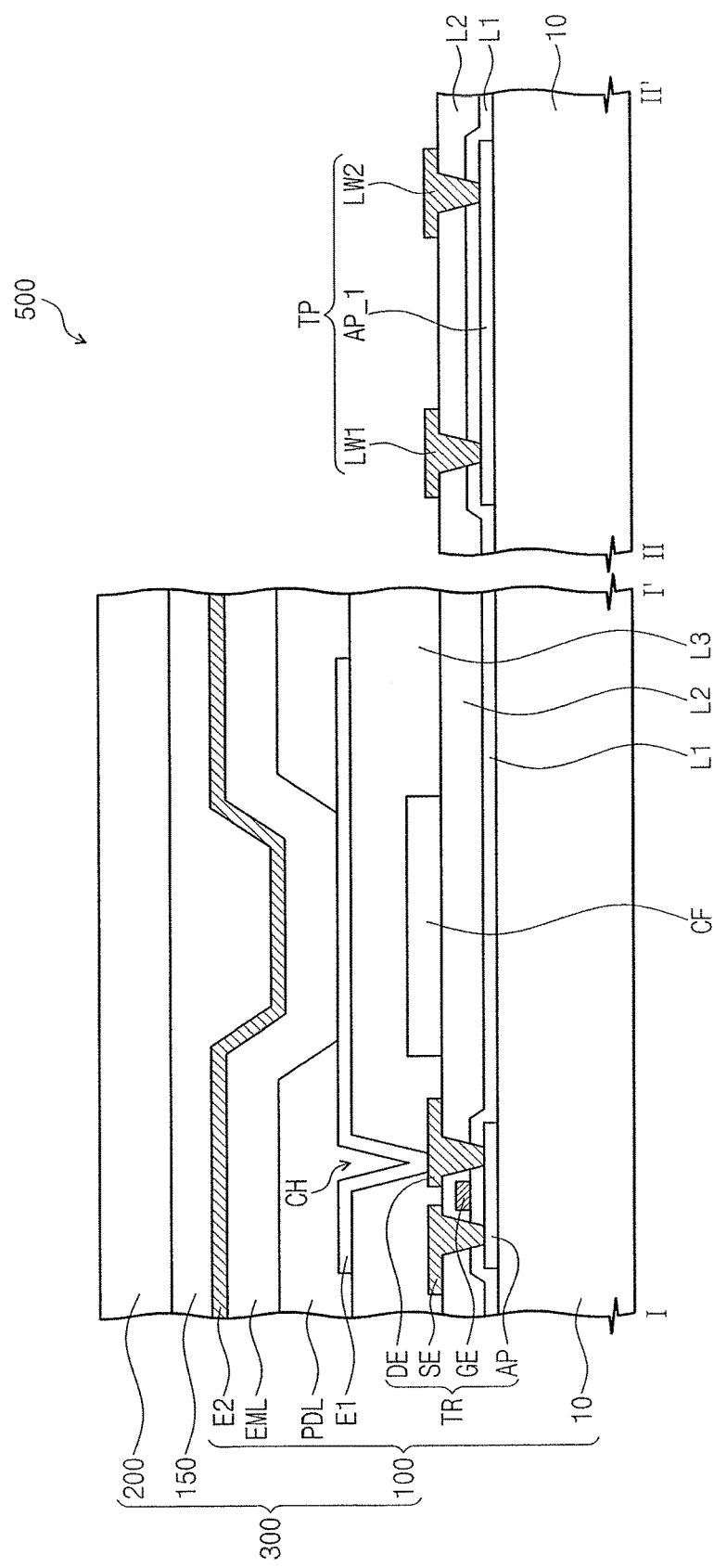
FIG. 2B illustrates views along section lines I-I' and II-II' in FIG. 2A.

FIG. 1 illustrates an embodiment of a flexible display device 500, FIG. 2A illustrates a partially enlarged side view showing a first area A1 in FIG. 1, and FIG. 2B is a cross-sectional view taken along lines I-I' and II-II' in FIG. 2A.

Referring to FIGS. 1, 2A, and 2B, the flexible display device 500 includes a display panel 300, a driving circuit film DF, a driving circuit board DP, an inspection part TP, and a detection part SP.

The display panel 300 displays an image in a display area DA thereof using light. In the present exemplary embodiment, the display panel 300 has a flexible property, and thus the display panel 300 may bend to increase convenience of use. The display panel 300 may be, for example, an organic light emitting display panel or another type of panel.

The display panel 300 includes a display substrate 100 and an opposite substrate 200. The opposite substrate 200 faces the display substrate 100 while being coupled to the display substrate 100 and prevents moisture and gas from entering into the display substrate 100. According to another embodiment, the opposite substrate 200 may be omitted in the display panel 300. In this case, the display panel 300 may include a sealing layer instead of the opposite substrate 200. The sealing layer may cover the display substrate 100 to prevent the moisture and gas from entering.

The display substrate 100 includes a base substrate 10, a thin film transistor TR, a first electrode E1, a color filter CF, a pixel definition layer PDL, an organic light emitting layer EML, and a second electrode E2. In the present exemplary embodiment, the display panel 300 may be a rear surface light emitting type organic light emitting display panel. In this case, the base substrate 10 may be an insulating substrate with light transmittance and flexible properties such as those, for example, of a plastic substrate.

The thin film transistor TR is disposed on the base substrate 10 and is electrically connected to the first electrode E1. The thin film transistor TR switches a driving signal applied to the first electrode E1. The thin film transistor TR includes an active pattern AP, a gate electrode GE, a source electrode SE, and a drain electrode DE. The source electrode SE is electrically connected to a driving signal line that transmits the driving signal and is disposed to overlap with the active pattern AP. The drain electrode DE is disposed to overlap the active pattern AP and electrically connect to the first electrode E1. Accordingly, when the thin film transistor TR is turned on, the driving signal is applied to the first electrode E1 through the turned-on thin film transistor from the driving signal line.

The active pattern AP includes a semiconductor material, which, for example, may include amorphous silicon or crystalline silicon. According to another embodiment, the active pattern AP may include an oxide semiconductor material such as IGZO, ZnO, $SnO_2$, $InO_3$, $Zn_2SnO_4$, $Ge_2O_3$, $HfO_2$, etc., a compound semiconductor material such as GsAs, GaP, InP, etc., or an organic semiconductor material, such as pentacene.

A gate insulating layer L1 is disposed between the gate electrode GE and the active pattern AP, and an inter-insulating layer L2 covers the gate electrode GE to insulate the gate electrode GE from the source and drain electrodes SE and DE. An organic layer L3 covers the thin film transistor TR and includes a contact hole CH formed therethrough. The first electrode E1 is electrically connected to the drain electrode DE through the contact hole CH.

The first electrode E1 is disposed on the organic layer L3 and serves as an anode electrode. As described above, when the display panel 300 is the rear surface light emitting type organic light emitting display panel, the first electrode E1 may be formed of a transparent conductive layer, e.g., indium tin oxide (ITO), indium zinc oxide (IZO), etc.

The pixel definition layer PDL is disposed on the organic layer L3, and the first electrode E1 is partially opened in an area corresponding to the first electrode E1. Thus, the organic light emitting layer EML is disposed on the first electrode E1 through the opened portion of the pixel definition layer PDL.

The organic light emitting layer EML is disposed on the first electrode E1, and the second electrode E2 that serves as a cathode electrode is disposed on the organic light emitting layer EML. Therefore, holes provided through the first electrode E1 and electrons provided through the second electrode E2 are recombined with each other in the organic light emitting layer EML, so that the organic light emitting layer EML emits light.

In the present exemplary embodiment, the light emitted from the organic light emitting layer EML may be white light. In this case, the organic light emitting layer EML may have a single-layer structure and is disposed in pixel and non-pixel areas. In addition, a hole injection layer and a hole transport layer may be sequentially disposed between the first electrode E1 and the organic light emitting layer EML. Also, an electron transport layer and an electron injection layer may be sequentially disposed between the organic light emitting layer EML and the second electrode E2.

The color filter CF is disposed on the base substrate 10 and filters the light emitted from the organic light layer EML. When the organic light emitting layer EML emits white light, the color filter CF filters the white light to output color light.

The second electrode E2 is disposed on the organic light emitting layer EML. In the present exemplary embodiment, the second electrode E2 may include a conductive material (e.g., a metal material) to reflect the light. The light emitted from the organic light emitting layer EML is reflected by the second electrode E2 and travels toward the color filter CF.

A protective layer 150 may be interposed between the display substrate 100 and the opposite substrate 200. The protective layer 150 may include, for example, a polymer material such as a polyimide resin, to prevent moisture and gas from entering into the display substrate 100.

The display panel 300 includes a bending portion BP configured to include a first bending area BA1 and a second bending area BA2 due to the flexible property thereof. In the present exemplary embodiment, since an edge of the display panel 300 is bent, the display panel 300 includes the bending portion BP and the first and second bending areas BA1 and BA2 overlap the display area DA. Thus, the image may be displayed in a portion of the bending portion BP. According to another embodiment, the bending portion BP may be disposed outside the display area DA and the image is not displayed in the bending portion BP.

The driving circuit board DP generates various signals to drive the display panel 300. For example, the driving circuit board DP may include a timing controller T-CON to generate driving signals to control the image displayed in the display panel 300.

The driving circuit film DF has a flexible property as a flexible printed circuit film and electrically connects a pad part PP of the display substrate 100 to the driving circuit board DP. Thus, the driving signals are applied to a driving chip DC bonded to the pad part PP through the driving circuit film DF.

In the present exemplary embodiment, the driving chip DC converts the driving signals into gate signals and data signals, and the gate and data signals are applied to gate lines and data lines, respectively, disposed on the display substrate 100. Therefore, pixels PXL electrically connected to the data lines and the gate lines are driven, so that the image is displayed in the display area DA.

The inspection part TP is disposed outside the display area DA and may be disposed, for example, on the bending portion BP. The inspection part TP may therefore be bent with the bending portion BP. In one embodiment, the inspection part TP includes an inspection pattern AP_1, a first connection wire LW1, and a second connection wire LW2. The inspection pattern AP_1 may have a width greater than that of the first and second connection wires LW1 and LW2. The first connection wire LW1 connects one end of the inspection pattern AP_1 to the detection part SP and the second connection wire LW2 connects another end of the inspection pattern AP_1 to the detection part SP.

In the present exemplary embodiment, each of the inspection pattern AP_1, the first connection wire LW1, and the second connection wire LW2 may include a material having a high brittleness as compared to the signal lines of the display panel 300, e.g., gate and data lines. For instance, when the signal lines of the display panel 300 include aluminum, the inspection pattern AP_1 may include a semiconductor material (e.g., silicon) and the first and second connection lines LW1 and LW2 may include molybdenum. Accordingly, cracks may easily occur in the inspection part TP to a greater degree than the signal lines of the display panel 300.

When the inspection pattern AP_1 includes silicon, the inspection pattern AP_1 may be formed through the same process as the active pattern AP. Thus, the inspection pattern AP_1 and the active pattern AP may be formed from the same material. The inspection pattern AP_1 and the active pattern AP may be disposed between the base substrate 10 and the gate insulating layer L1.

The detection part SP is electrically connected to the inspection pattern TP by the first and second connection wires LW1 and LW2. The detection part SP is mounted on the driving circuit substrate DP, and the detection part SP and the inspection pattern AP_1 are electrically connected to each other by the first and second connection wires LW1 and LW2 extending along the pad part PP and the driving circuit film DF.

The detection part SP applies an inspection signal to the inspection pattern AP_1 through the first connection wire LW1 and receives an output signal output from the inspection pattern AP_1 through the second connection wire LW2, which corresponds to the inspection signal. In addition, the detection part SP compares the inspection signal and the output signal to detect the cracks in the inspection pattern AP_1. For instance, the detecting part SP includes a logic circuit that compares a voltage value of the input signal and a voltage value of the output signal to measure a resistance of the inspection pattern AP_1. In this case, the detection part SP detects the cracks of the inspection pattern AP_1 on the basis of a variation in resistance of the inspection pattern AP_1.

In the present exemplary embodiment, the detection part SP is mounted on the driving circuit board DP. However, in other embodiments, the logic circuit of the detecting part may be built into the driving chip DC, and thus the driving chip DC may serves as the detection part SP.

The detection part SP is electrically connected to the timing controller T-CON by a third connection wire LW3 and applies a result signal related to the occurrence of the cracks in the inspection pattern AP_1 to the timing controller T_CON through the third connection wire LW3. Therefore, the timing controller T_CON controls the driving of the display panel 300 in response to the result signal. For instance, when the cracks occur in the inspection pattern AP_1, the timing controller T_CON turns off the display panel 300 on the basis of the result signal.

According to the configurations of the inspection part and the detection part TP, a possibility of cracks occurring in the bending portion BP may be predicted on the basis of whether cracks occur in the inspection part TP. In addition, since the timing controller T_CON receives the result signal from the detection part SP, the flexible display device 500 may control the driving of the display panel 300.

According to one application, when the flexible display device 500 is manufactured, potential defects in operation of the display panel 300, caused by the cracks in the bending portion BP, may be easily detected using the detection part SP and the inspection part TP. In addition, because a user perceives turn-off of the display panel 300, generated by the operations of the inspection part TP and the detection part SP, as potential defects in operation of the display panel 300, the user is prevented from feeling inconvenient while the user uses the flexible display device 500.

Figure 3:
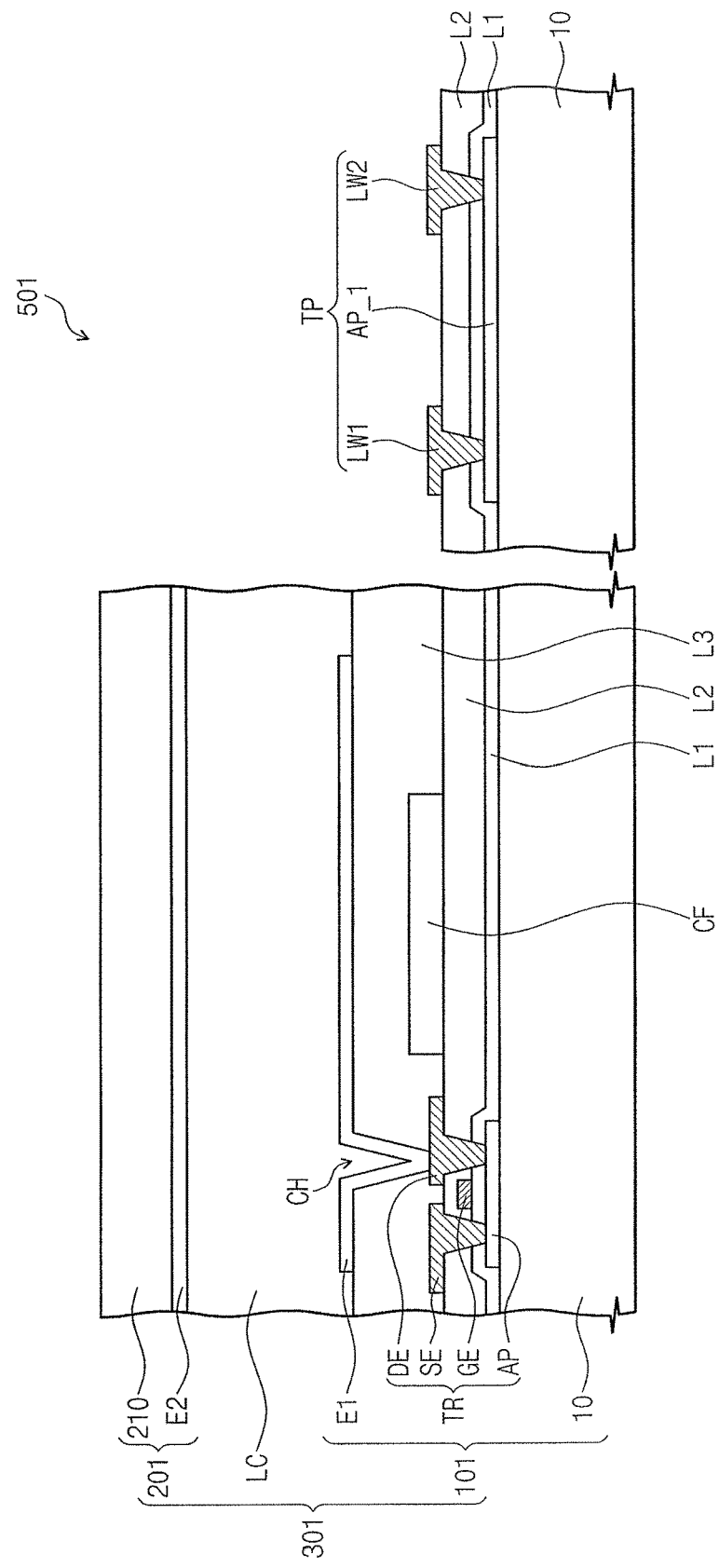
FIG. 3 illustrates another embodiment of a flexible display device.

FIG. 3 is a cross-sectional view of another embodiment of a flexible display device 501 which includes a display panel 301. The display panel 301 may be a liquid crystal display panel having a flexible property. The display panel 301 includes a display substrate 101, an opposite substrate 201, and a liquid crystal layer LC.

The display substrate 101 includes a first base substrate 10, a thin film transistor TR disposed on the first base substrate 10, a first electrode E1 electrically connected to the thin film transistor TR, and a color filter CF. In addition, the opposite substrate 201 includes a second base substrate 210 facing the first base substrate 10 and a second electrode E2 disposed on the second base substrate 210.

The liquid crystal layer LC is disposed between the display substrate 101 and the opposite substrate 210. A backlight unit may be disposed under the display panel 301 to supply the light to the display panel 301.

As described with reference to FIG. 1, the display panel 301 of the flexible display device 501 includes a bending portion and an inspection portion TP disposed on the bending portion. In addition, the flexible display device 501 includes a driving circuit film, a driving circuit board, and a detection part similar to those shown in FIG. 1. Accordingly, the detection part may detect the cracks in the inspections part TP and controls the display panel 301 to be turned off on the basis of the output signal relating to the cracks in the inspection part TP.

Figure 4:
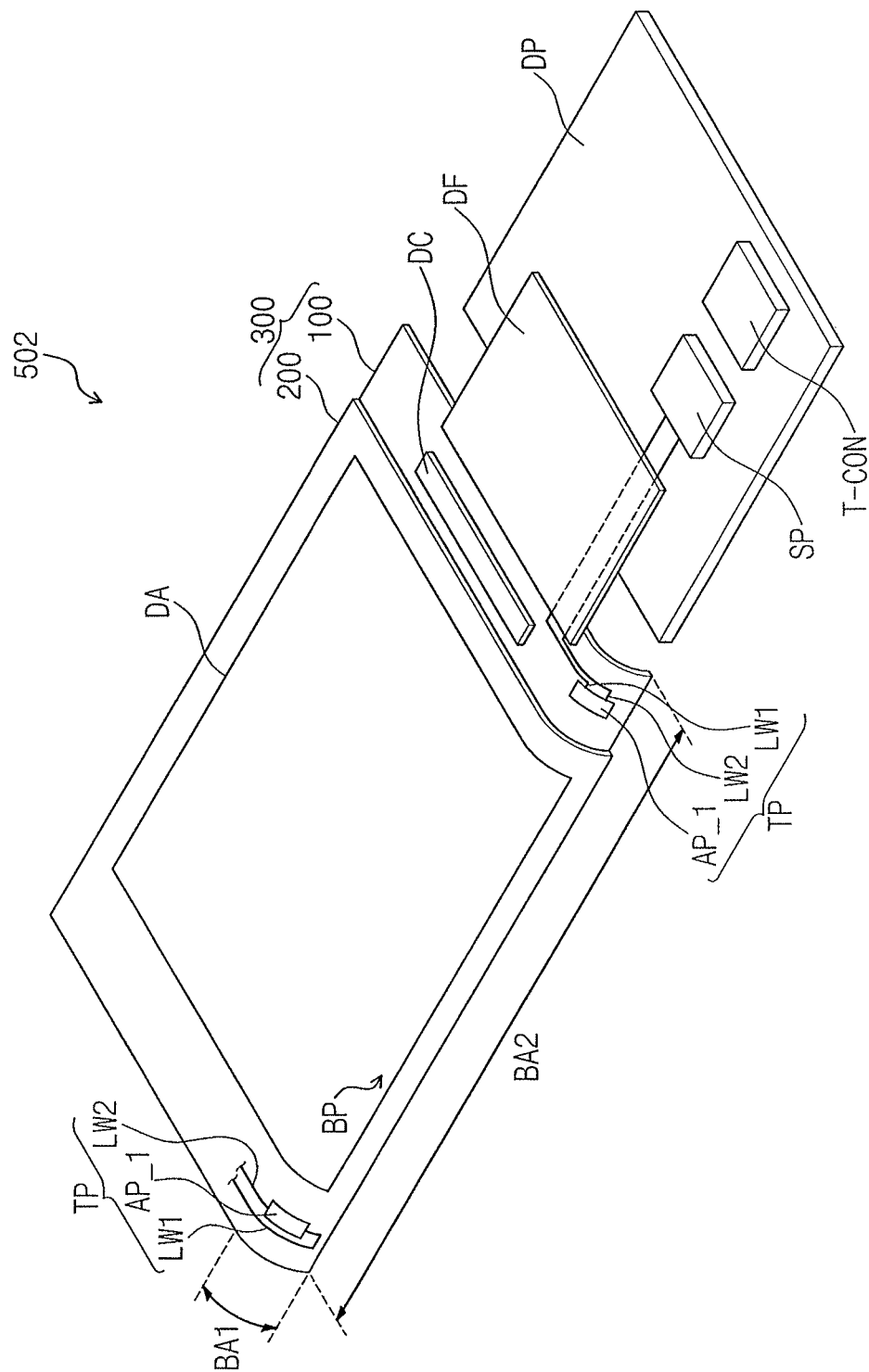
FIG. 4 illustrates another embodiment of a flexible display device.

FIG. 4 illustrates another embodiment of a flexible display device 502 which includes a display panel 300. The display panel 300 includes a bending portion BP configured to include first and second bending areas BA1 and BA2.

The inspection part TP described with reference to FIG. 1 is disposed in the bending portion BP in a plural number. For instance, two inspection parts TP may be provided to the bending portion BP, one inspection part TP of the two inspection parts TP is disposed at one end of the bending portion BP, and the other inspection part TP of the two inspection parts TP is disposed at the other end of the bending portion BP.

The two inspection parts TP are disposed at different positions from each other. Each of the inspection parts TP may have a similar configuration to that of the inspection part TP described with reference to FIG. 1. More specifically, each of the inspection parts TP may include an inspection pattern AP_1, a first connection wire LW1, and a second connection wire LW2, which are disposed in the first and second bending areas BA1 and BA2. The first connection wire LW1 and the second connection wire LW2 electrically connect the inspection pattern AP_1 to the detection part SP after detouring the display area DA.

Figure 5:
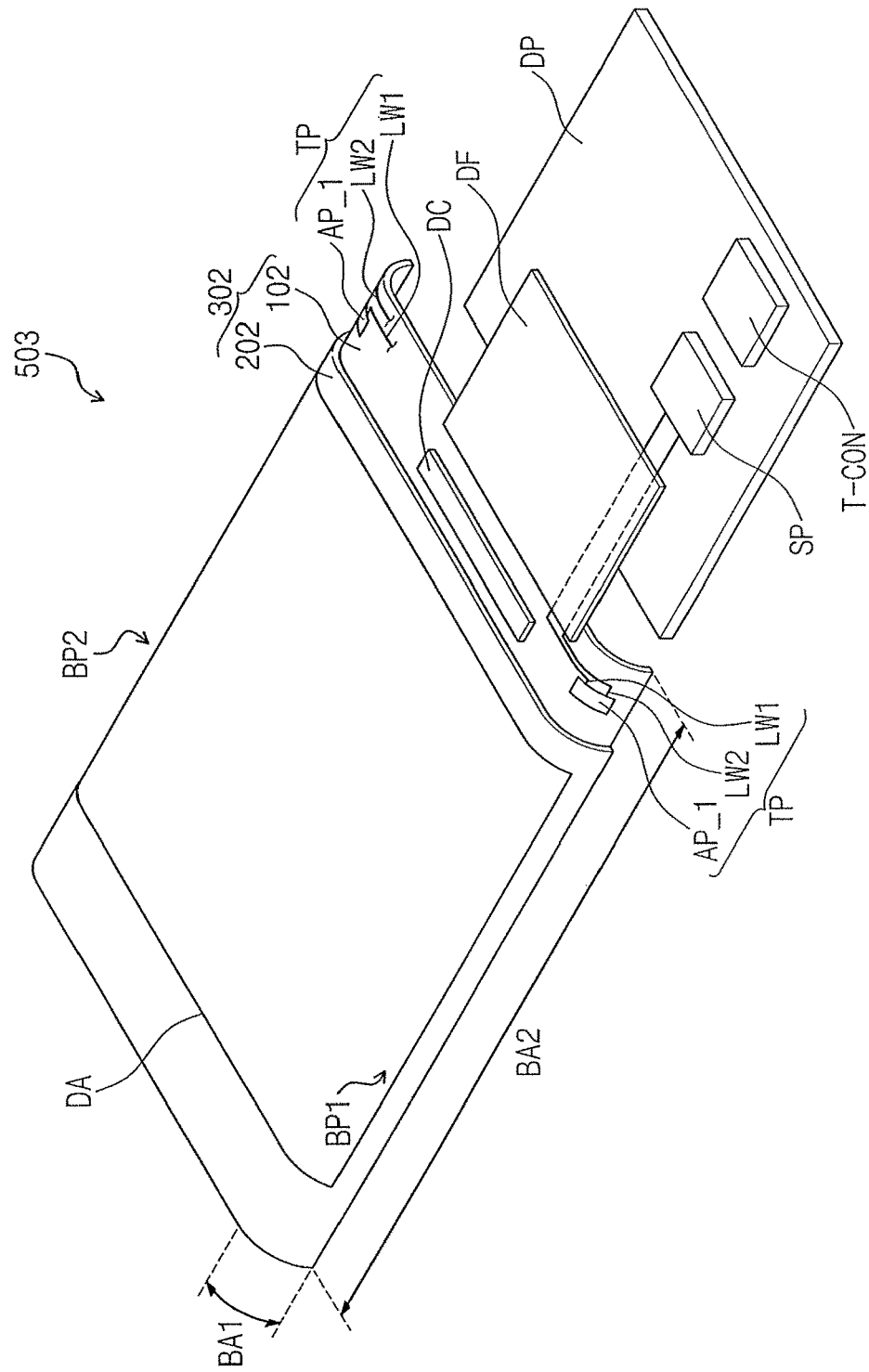
FIG. 5 illustrates another embodiment of a flexible display device.

FIG. 5 illustrates another embodiment of a flexible display device 503 which includes a display panel 302. The display panel 302 includes a display substrate 102 and an opposite substrate 202. In the present exemplary embodiment, the display panel 302 includes a plurality of bending portions. For instance, the display panel 302 includes a first bending portion BP1 and a second bending portion BP2, and the first and second bending portions BP1 and BP2 are disposed at both edges of the display panel 302.

In addition, two inspection parts TP are provided to the display panel 302 and disposed to correspond to the first and second bending portions BP1 and BP2 in a one-to-one correspondence. The two inspection parts TP are disposed at different positions from each other. Each of the inspection parts TP may have a similar configuration to that of the inspection part TP described with reference to FIG. 1. More specifically, each of the inspection parts TP may include an inspection pattern AP_1, a first connection wire LW1, and a second connection wire LW2. The first connection wire LW1 and the second connection wire LW2 may electrically connect the inspection pattern AP_1 to the detection part SP after traversing around the display area DA.

Figure 6:
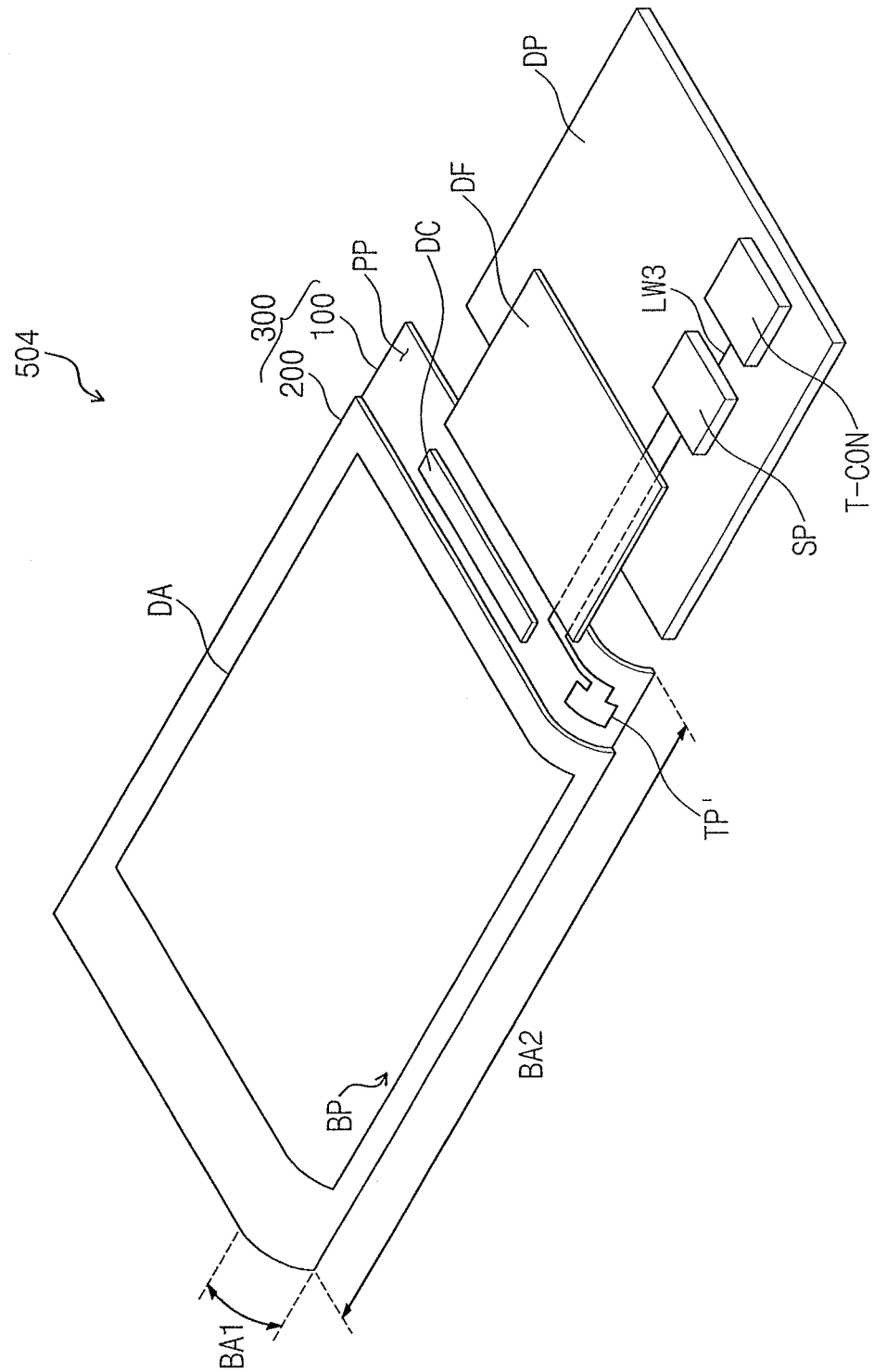
FIG. 6 illustrates another embodiment of a flexible display device.

FIG. 6 illustrates another embodiment of a flexible display device 504 including an inspection part TP' having a line shape electrically connected to the detection part SP. In this case, the inspection part TP' may include a metal material (e.g., molybdenum), with a brittleness higher than that of aluminum used to form the signal lines of the display panel.

In the flexible display device 504 shown in FIG. 6, although the inspection part TP' has the line shape without including the inspection pattern AP_1 (refer to FIG. 1), cracks occurring in the inspection part TP' may be easily detected by the inspection part TP' and the detection part SP, because the inspection part TP' includes the metal material in which the cracks are easily transmitted.

By way of summation and review, a malfunction in a flexible display device may occur as a result of excessive stress applied to its signal lines and conductive patterns. Such a malfunction may include the formation of cracks in the signal lines and conductive patterns. These cracks might be found during an inspection process, but only after the cracks have become significantly long so as to make then noticeable. Cracks of smaller or minute length may not be detected, but still may cause defects and/or malfunctions that will only get worse over time.

In contrast, embodiments provide a flexible display device including a display panel, an inspection part, and a detection part. The display panel includes a bending portion and displays an image. The inspection part is disposed on the bending portion and bent together with the bending portion. The detection part applies an inspection signal to the inspection part and receives an output signal output from the inspection part, and the detection part compares the inspection part and the output signal to detect a crack of the inspection part.

According to the above, the crack occurring in the inspection part disposed in the bending portion of the display panel may be detected by the detection part. Since the inspection part is bent together with the display panel, a possibility that the cracks occur in the display panel may be predicted on the basis of the cracks in the inspection part Thus, when the crack occurring in the inspection part is detected by the detection part, the result signal related to the occurrence of the crack in the inspection part is applied to the driving circuit substrate, and the driving circuit substrate controls the display panel to be turned off on the basis of the result signal.

Therefore, when the flexible display device is manufactured, potential defects in operation of the display panel, which are caused by the crack in the bending portion, may be easily detected using the detection part and the inspection part. In addition, since a user perceives the turn-off of the display panel, which is generated by the operations of the inspection part and the detection part as the potential defects in operation of the display panel, the user is prevented from feeling inconvenient while the user uses the flexible display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display device comprising:
   a display panel including a bending portion configured to display an image;
   an inspection pattern on the bending portion;
   a driving circuit board driving the display panel;
   a detector disposed on the driving circuit board; and
   a connection wire electrically connecting the inspection pattern and the detector,
   wherein the detector is to apply an inspection signal to the inspection pattern and to receive an output signal from the inspection pattern, wherein the detector is to compare the inspection signal and the output signal to detect a crack in the inspection pattern.

2. The flexible display device as claimed in claim 1, wherein the connection wire comprises:
   a first connection wire connected to one end of the inspection pattern; and
   a second connection wire connected to another end of the inspection pattern.

3. The flexible display device as claimed in claim 2, wherein the detector applies the inspection signal to the inspection pattern through the first connection wire, and receives the output signal from the inspection pattern through the second connection wire.

4. The flexible display device as claimed in claim 2, further comprising:
   a timing controller disposed on the circuit board; and
   a third connection wire electrically connecting the detector and the timing controller.

5. The flexible display device as claimed in claim 1, wherein the detector detects a crack occurring in the inspection pattern based on a resistance of the inspection pattern, the detector determining the resistance of the inspection pattern based on the inspection signal and the output signal.

6. The flexible display device as claimed in claim 5, wherein the detector outputs a result signal indicative of the crack in the inspection pattern to the driving circuit board, and wherein the driving circuit board controls the display panel based on the result signal.

7. The flexible display device as claimed in claim 6, wherein the driving circuit board controls the display panel to be turned off when the crack is detected in the inspection pattern.

8. The flexible display device as claimed in claim 1, wherein the detector comprises a logic circuit that compares a voltage value of the input signal and a voltage value of the output signal to measure a resistance of the inspection pattern.

9. The flexible display device as claimed in claim 1, wherein the display panel comprises:
 a substrate; and
 a signal line disposed on the substrate, the signal line includes gate line and data line, and wherein the inspection pattern is more brittle comparing to the signal line.

10. The flexible display device as claimed in claim 1, wherein the inspection pattern comprises a semiconductor material.

11. The flexible display device as claimed in claim 10, wherein the display panel comprises:
 a substrate;
 a thin film transistor on the substrate;
 a first electrode electrically connected to the thin film transistor;
 an organic light emitting layer on the first electrode emitting light; and
 a second electrode on the organic light emitting layer.

12. The flexible display device as claimed in claim 11, wherein the inspection pattern comprises a same material as an active layer of the thin film transistor.

13. The flexible display device as claimed in claim 10, wherein the display panel comprises:
 a first substrate;
 a thin film transistor on the first substrate;
 a first electrode electrically connected to the thin film transistor;
 a second substrate facing the first substrate;
 a second electrode on the second substrate; and
 a liquid crystal layer between the first and second substrates.

14. The flexible display device as claimed in claim 13, wherein the inspection pattern comprises a same material as an active layer of the thin film transistor.

15. A display device, comprising:
 a display panel including a bending portion configured to display an image;
 an inspection pattern on the bending portion;
 a driving circuit board driving the display panel;
 a detector is disposed on the driving circuit board; and
 a connection wire electrically connecting the inspection pattern and the detector,
wherein the inspection pattern and the bending portion have substantially a same brittleness, and wherein the inspection pattern outputs a signal indicative of a crack in the inspection pattern.

* * * * *